(12) United States Patent
Henneken et al.

(10) Patent No.: US 6,891,313 B1
(45) Date of Patent: May 10, 2005

(54) ELECTRODE CONTACT FOR A PIEZOCERAMIC ACTUATOR AND METHOD FOR PRODUCING SAME

(75) Inventors: Lothar Henneken, Ludwigsburg (DE); Armin Glock, Urbach (DE); Juergen Hackenberg, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 84 days.

(21) Appl. No.: 10/049,181

(22) PCT Filed: Aug. 2, 2000

(86) PCT No.: PCT/DE00/02527

§ 371 (c)(1),
(2), (4) Date: Jun. 14, 2002

(87) PCT Pub. No.: WO01/11699

PCT Pub. Date: Feb. 15, 2001

(30) Foreign Application Priority Data

Aug. 6, 1999 (DE) .......................... 199 36 713

(51) Int. Cl.[7] .............................................. H01L 41/08
(52) U.S. Cl. ........................ 310/328; 310/364; 310/366
(58) Field of Search ........................ 310/328, 363–366

(56) References Cited

U.S. PATENT DOCUMENTS

| | | | | |
|---|---|---|---|---|
| 4,845,399 A | * | 7/1989 | Yasuda et al. | 310/366 |
| 5,196,756 A | * | 3/1993 | Kohno et al. | 310/328 |
| 5,233,260 A | * | 8/1993 | Harada et al. | 310/328 |
| 5,459,371 A | * | 10/1995 | Okawa et al. | 310/363 |
| 6,208,026 B1 | * | 3/2001 | Bindig et al. | 257/718 |

FOREIGN PATENT DOCUMENTS

| | | |
|---|---|---|
| DE | 42 24 284 | 1/1993 |
| DE | 196 48 545 | 5/1998 |
| DE | 197 53 930 | 6/1999 |
| JP | 60 196981 | 10/1985 |
| JP | 61 234580 | 10/1986 |

* cited by examiner

*Primary Examiner*—Mark Budd
(74) *Attorney, Agent, or Firm*—Kenyon & Kenyon

(57) ABSTRACT

A piezoceramic actuator includes a monolithic stack of thin piezoceramic films having internal electrodes arranged between the films, and rail-like elements electrochemically shaped onto the internal electrodes on outer sides of the stack. The internal electrodes can thereby be interconnected, via a suitable conductive element, in electrically conductive fashion at a certain distance from the side edges of the piezoceramic films so that these films form a continuous planar electrically conductive ribbon.

7 Claims, 1 Drawing Sheet

ELECTRODE CONTACT FOR A PIEZOCERAMIC ACTUATOR AND METHOD FOR PRODUCING SAME

FIELD OF THE INVENTION

The present invention relates to a piezoceramic actuator, substantially made up of a sintered monolithic stack of thin piezoceramic films having internal electrodes, arranged between the films, that are electrically interconnected on the outer side of the stack to form at least two electrode groups, electrically separated from one another, having alternatingly successive internal electrodes of the at least two groups.

BACKGROUND OF THE INVENTION

Piezoceramic materials have the property of becoming electrically charged when impinged upon by mechanical forces, i.e. in particular under mechanical compression or tension. On the other hand, the result of an electric field applied to the piezoceramic material is that the material is mechanically distorted, i.e. expands or contracts.

These latter effects are utilized in actuators in order to perform positioning motions.

As a result of the construction of the actuator from a stack of piezoceramic films having a corresponding number of internal electrodes, a high electric field strength can be achieved within the piezoceramic films even with a limited electrical operating voltage, since in the case of two electrode groups, the operating voltage is present between each two adjacent internal electrodes.

Contacting of the internal electrodes can present practical difficulties. In conventional actuators, side regions of the stack that are separated from one another are metal-coated in such a way that the one coating is electrically connected to the internal electrodes of the one group, and the other coating is electrically connected to the internal electrodes of the other group.

Upon operation of the actuators, these metal coatings are exposed to considerable mechanical stresses when the actuator expands or contracts in accordance with the particular operating voltage. Large alternating stresses can occur in this context if the operating voltage is frequently switched on and off or is switched over in terms of its polarity.

These mechanical stresses in the metal coatings can result in cracks in the coating, with the consequence that a variable number of internal electrodes can no longer be connected to the operating voltage source and the adjacent piezoceramic films cannot, or essentially cannot, contribute further to the work of the actuator.

It is therefore proposed in German Patent 196 48 545 A1 to cover the aforesaid metal coatings with a further electrically conductive layer that is mechanically particularly flexible, in order to keep the fragments of the aforesaid coating which in German Patent 196 48 545 A1 are also referred to as the "base metallization"—continuously in electrically conductive contact with one another. This additional coating can, for example, take the form of a knitted or braided wire structure, or that of a metal foam or corrugated sheet.

SUMMARY OF THE INVENTION

The present invention provides a piezoceramic actuator which has a stack of thin piezoceramic films having internal electrodes arranged between the films, each of the internal electrodes extending, at least on a region of the outer side of the stack, by way of rail-like or tab-like metal elements which preferably can be formed by electrolytically deposited metal. The internal electrodes can thereby be interconnected in electrically conductive fashion at a certain distance from the side edges of the piezoceramic films, for example by way of optionally corrugated metal films, knitted metal structures, or the like, or conductive plastic films, for example silicone films into which electrically conductive particles are embedded, so that these films form a continuous planar electrically conductive ribbon.

The rails or tabs that extend the internal electrodes outside the piezoceramic stack thus form a noncontinuously structured, strip-shaped base metallization, these rails or tabs being little stressed, if at all, by the mechanical motions of the adjacent piezoceramic films during operation of the actuator. Because these rails or tabs are electrically interconnected in mechanically flexible fashion, a particularly strong actuator can be achieved.

DETAILED DESCRIPTION

Figure 1:
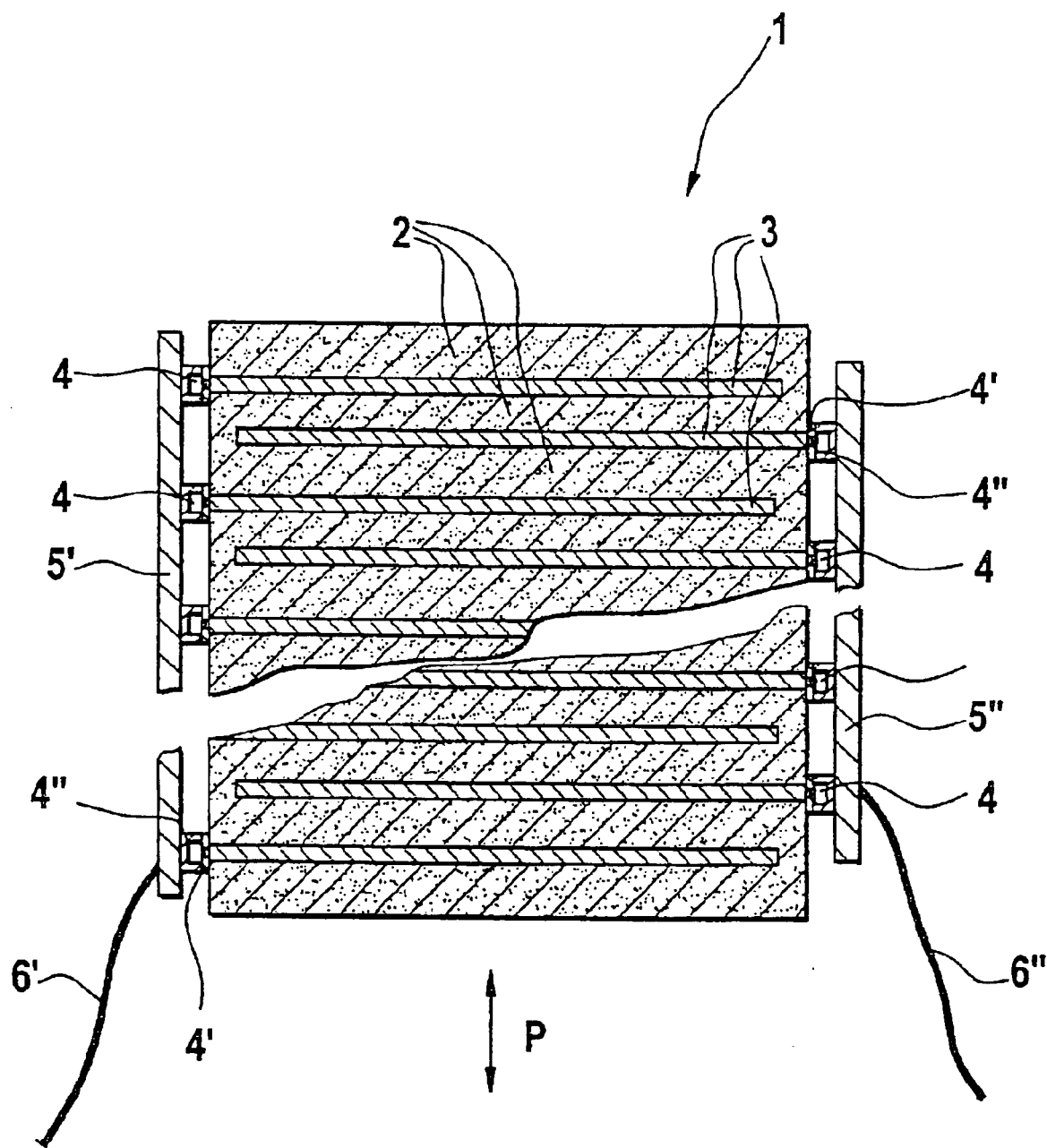
FIG. 1 shows a cross-sectional view of an actuator according to the present invention.

According to FIG. 1, a piezoceramic actuator 1 according to the present invention is substantially made up of a stack of sintered piezoceramic films 2 having arranged between them metallic internal electrodes 3 which extend alternately to the right and left side of actuator 1 that is depicted, i.e. are accessible from outside between the adjacent piezoceramic films 2. On the respectively opposite edge region, each internal electrode is covered by the adjacent piezoceramic films 2, so that the edge of the respective internal electrode 3 is inaccessible from the outside.

By electrolytic metal deposition (presented below), rail-like extensions 4, which for example are each made up of a nickel layer 4' directly adjacent to inner electrodes 3 and a gold layer 4" located externally thereabove, are shaped onto the externally accessible edge regions of inner electrodes 3 to the right and left in the drawing.

The exposed edges of rail-like extensions 4 are electrically interconnected via electrically conductive films 5' and 5" which are made, for example, of plastic, e.g. silicone or copolymers, and electrically conductive carbon or metal particles embedded therein; in order to achieve the desired electrical conductivity, these particles are very densely packed, and the plastic material serves substantially to ensure mechanical bonding of the particles.

Rail-like extensions 4 and films 5' and 5" can be interconnected in electrically conductive fashion, for example, by hot pressing.

The two films 5' and 5" are in turn electrically connected to connector lines 6' and 6" through which films 5' and 5", and thus internal electrodes 3 electrically connected thereto, can be connected to an operating voltage source, in such a way that the group of internal electrodes 3 electrically connected to film 5', and internal electrodes 3 electrically connected to film 5" and engaging in comb fashion between the aforesaid internal electrodes 3, respectively have electrically opposite polarities, and each piezoceramic film 2 located therebetween is impinged upon by a corresponding electric field.

Depending on the polarity of the electrical operating voltage, the upper and lower ends of actuator 1 then perform motions relative to one another in accordance with arrow P.

Since films 5' and 5" are spatially separated from the edges of piezoceramic films 2, and since films 5' and 5" moreover possess a certain elastic flexibility, the motions of actuator 1 cannot cause any damage to films 5' and 5".

Films 5' and 5" may also exhibit a corrugated structure, in such a way that an externally convex ridge extends between each two internal electrodes 3 attached adjacently to film 5' or 5", and between their rail-shaped extensions 4.

Alternatively, it is also possible to replace the conductive films 5' and 5" with metal knitted structures or meshes, or also with a layer of metal foam.

Electrochemical production of rail-shaped extensions 4 can be accomplished as follows.

The stack of sintered piezoceramic films 2, having internal electrodes 3 arranged therebetween, is immobilized in a holder. Internal electrodes 3 are then electrically contacted to one another on the two opposite sides (in FIG. 1, depicted on the right and left sides of the stack), but in such a way that the respective contacts still leave open a larger continuous region of the mutually opposite sides of the stack.

This is followed by cleaning of the stack in a neutral cleaner, for example at a temperature of 55° C. and a treatment time of five minutes.

A rinse in demineralized water is then performed.

Electrochemical metal deposition is now performed, for example a nickel deposition or deposition of a nickel alloy from a nickel sulfamate electrolyte which, in the case of deposition of an alloy, contains corresponding additives or alloy components. A noble metal deposition from a corresponding electrolyte can optionally also be accomplished.

During deposition, internal electrodes 3 are electrically connected as the cathode via the aforesaid contacts of the stack, and a suitable anode is used.

The nickel sulfamate electrolyte can have a pH of between 3 and 4 and a temperature of approximately 40° C. Other electrolytes are operated under similar process conditions.

The electrical current intensity between cathode and anode can be 1 mA/cm$^2$ referred to the exposed ceramic surface. With this, a deposition rate of approx. 0.1 $\mu$m/min is achieved. After the production of metal layers 4', another rinse in demineralized water is performed.

A hard gold deposition in a gold electrolyte is then performed, internal electrodes 3 again being connected as the cathode; an anode of platinum-plated titanium can be used. The pH of the gold electrolyte can be set to a value of 4 to 5. The temperature can once again be 40° C. The current intensity can once again be 1 mA/cm$^2$ referred to the exposed ceramic surface of the ceramic film stack.

Alternatively, a uniform gold layer approx. 0.1 mm thick can also be deposited in electroless fashion from a hot gold electrolyte. The temperature for this method step can be between 80° C. and 90° C.

Another rinse in demineralized water is then performed.

Rail-like extensions 4 are now available for connection to the electrically conductive films 5' and 5" or the like.

What is claimed is:

1. A piezoceramic actuator comprising:

a monolithic stack of thin piezoceramic films; and internal electrodes arranged between the films, the internal electrodes being electrically interconnected on outer sides of the stack to form at least two electrode groups electrically separated from one another, the internal electrodes each having a rail-like extension in a region of the outer side of the stack;

wherein each rail-like extension has one of electrochemically deposited nickel-alloy and nickel; and wherein each rail-like extension is made of nickel-alloy layer and a gold layer.

2. The piezoceramic actuator according to claim 1, wherein at least one of metal knitted structures, metal meshes and metal foam electrically interconnecting exposed edges of each rail-like extension at a distance from the outer sides of the stack.

3. The piezoceramic actuator according to claim 2, wherein each rail-like extension has one of electrolytically deposited nickel-alloy and nickel.

4. A piezoceramic actuator comprising:

a monolithic stack of thin piezoceramic films; and internal electrodes arranged between the films, the internal electrodes being electrically interconnected on outer sides of the stack to form at least two electrode groups electrically separated from one another, the internal electrodes each having a rail-like extension in a region of the outer side of the stack;

wherein each rail-like extension has one of electrochemically deposited nickel-alloy and nickel; and wherein each rail-like extension is made of nickel-alloy layer and an adjacent gold layer.

5. The piezoceramic actuator according to claim 2, wherein the at least one of metal knitted structures, metal meshes and metal foam is at least partially made from plastic.

6. The piezoceramic actuator according to claim 5, wherein the at least one of metal knitted structures, metal meshes and metal foam is at least partially made from at least one of electrically conductive carbon or metal particles.

7. A piezoceramic actuator comprising:

a monolithic stack of thin piezoceramic films; and internal electrodes arranged between the films, the internal electrodes being electrically interconnected on outer sides of the stack to form at least two electrode groups electrically separated from one another, the internal electrodes each having a rail-like extension in a region of the outer side of the stack;

wherein each rail-like extension has an electrochemically deposited nickel-alloy.

* * * * *